United States Patent
Vomberg

[19]

[11] Patent Number: 6,158,492
[45] Date of Patent: Dec. 12, 2000

[54] APPARATUS FOR MAKING A FOIL-CLAD LAMINATE

[75] Inventor: Rainer Vomberg, Wegberg, Germany

[73] Assignee: G. Siempelkamp GmbH & Co., Krefeld, Germany

[21] Appl. No.: 09/121,462

[22] Filed: Jul. 23, 1998

[30] Foreign Application Priority Data

Jul. 23, 1997 [DE] Germany .......................... 197 31 538

[51] Int. Cl.⁷ .............................. B32B 31/00; H05K 3/00
[52] U.S. Cl. .......................... 156/522; 156/552; 156/555; 156/563; 156/580; 29/825
[58] Field of Search .................... 156/522, 552, 156/563, 556–555, 521, 580; 29/825

[56] References Cited

U.S. PATENT DOCUMENTS

| | | | |
|---|---|---|---|
| 3,989,235 | 11/1976 | Hüsges | 270/58.04 |
| 4,356,054 | 10/1982 | Götz | 156/517 |
| 4,599,128 | 7/1986 | Held | 156/322 |
| 4,610,747 | 9/1986 | Bregenzer | 156/322 |
| 5,160,567 | 11/1992 | Konicek et al. | 156/288 |
| 5,354,409 | 10/1994 | Götz | 156/552 |
| 5,504,993 | 4/1996 | Szerlip et al. | 29/849 |
| 5,698,470 | 12/1997 | Yamaguchi | 216/20 |
| 5,874,152 | 2/1999 | Middelman | 428/105 |
| 6,021,833 | 2/2000 | Uchikawa et al. | 156/521 |

FOREIGN PATENT DOCUMENTS

WO 92/18334  10/1992  WIPO .

Primary Examiner—Linda L. Gray
Attorney, Agent, or Firm—Herbert Dubno; Andrew Wilford

[57] ABSTRACT

A laminate-making system has a housing forming a tunnel extending in a transport direction and having a downstream end at an assembly station, a press-plate feeder for conveying a succession of press plates along a path through the tunnel to the assembly station, respective upper and lower supports holding respective upper and lower coils of metallic foil above and below the path at the assembly station, and a core-plate feeder for conveying a succession of core plates to a lay-up station adjacent the assembly station. Respective upper and lower foil feeders pull the foils off the respective coils and apply them to upper and lower faces of the press plates at the assembly station. A gripper beam engages leading ends of the foils and of the press plate in the assembly station for pulling the press plate and the foils from the assembly station into the lay-up station and depositing the press plate and foils atop the core plate therein. A cutter transversely severs the foils immediately downstream of the press plate after the press plate has been pulled by the gripper beam from the assembly station into the lay-up station.

17 Claims, 7 Drawing Sheets

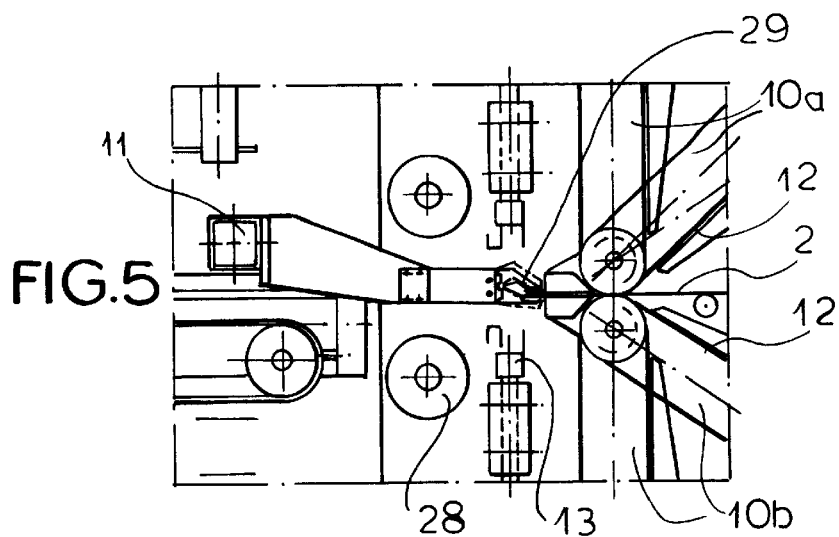
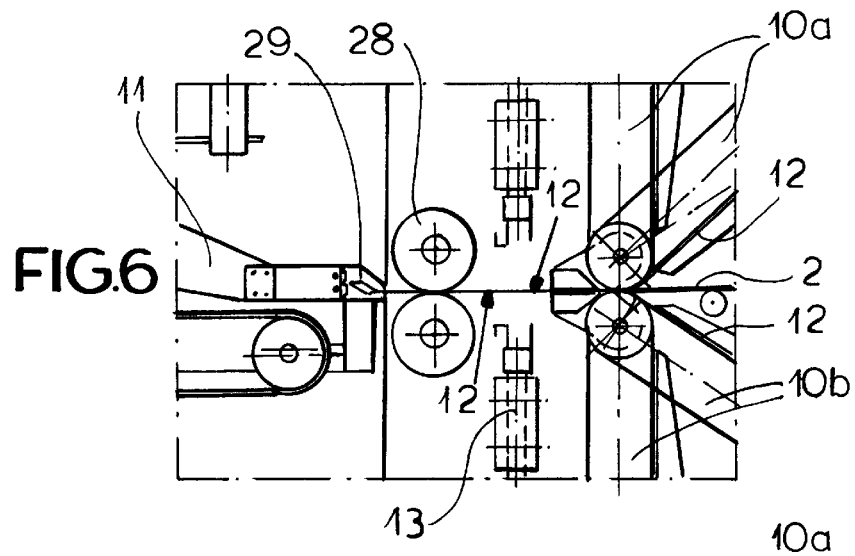
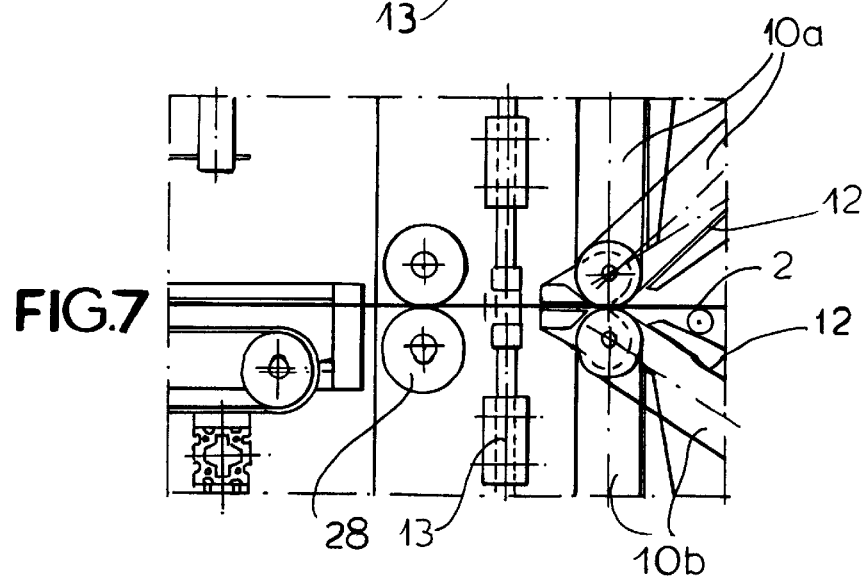

APPARATUS FOR MAKING A FOIL-CLAD LAMINATE

FIELD OF THE INVENTION

The present invention relates to the manufacture of rigid foil-clad laminates. More particularly this invention concerns a method of and apparatus for the production of industrial-quality laminate boards whose faces are covered with metallic foils or sheets, for making printed-circuit boards.

BACKGROUND OF THE INVENTION

A standard printed-circuit board is formed of a rigid phenolic or epoxy core plate to each of whose faces is laminated a copper foil. Such workpieces are made as described in WO 92/18,334 in a mass-production operation by forming in a lay-up station a stack or book comprised of a bottom relatively thick stainless-steel carrier plate atop which is formed a sandwich of a lower copper foil, a plastic core plate, and an upper copper foil, and a stainless-steel press plate is set atop this sandwich. Further such sandwiches and press plates are stacked atop this sandwich to form the pressable book that is then transported to a plate press where the entire stack is subjected to heat and pressure to polymerize the plastic and thereby bond the foils to the respective faces of the respective core plates. After the pressing operation the carrier plate and press plates are separated from the finished workpieces and are recycled to the lay-up station.

The finished workpieces are etched to form extremely narrow, e.g. 0.003 in wide, circuit paths so the finished workpieces must be produced to very high tolerances with no significant surface defects. Thus it is critical to keep the various elements that are used in the production free of any dust or the like that could form surface defects and make the workpieces unusable.

In the above-cited European patent publication two separate clean rooms are used, one holding the copper foil-sheets and the other the plastic prepreg plates. In one of the clean rooms there is a lay-up station where a foil is laid atop a press plate, then this subassembly is transported through a window between the rooms to the second clean room where the prepreg sheet is set atop it, and then this assembly is transported to a stacking station where the book is formed.

Such a system is fairly complex and takes up a great deal or space.

OBJECTS OF THE INVENTION

It is therefore an object of the present invention to provide an improved system for making laminates of this type.

Another object is the provision of such an improved system for making laminates of this type which overcomes the above-given disadvantages, that is which is relatively simple, yet which surely prevents particles and the like from getting on the copper foils.

SUMMARY OF THE INVENTION

A laminate-making system has according to the invention a housing forming a tunnel extending in a transport direction and having a downstream end at an assembly station, a press-plate feeder for conveying a succession of press plates along a path through the tunnel to the assembly station, respective upper and lower supports holding respective upper and lower coils of metallic foil above and below the path at the assembly station, and a core-plate feeder for conveying a succession of core plates to a lay-up station adjacent the assembly station. Respective upper and lower foil feeders pull the foils off the respective coils and apply them to upper and lower faces of the press plates at the assembly station. A gripper beam engages leading ends of the foils and of the press plate in the assembly station for pulling the press plate and the foils from the assembly station into the lay-up station and depositing the press plate and foils atop the core plate therein. A cutter transversely severs the foils immediately downstream of the press plate after the press plate has been pulled by the gripper beam from the assembly station into the lay-up station.

Thus with this system the possibility of particles getting between the press plates and the foils is largely eliminated. The press plates are purged of any particles by being blasted in the tunnel with dust-free air, and according to the invention the tunnel is normally extended around the assembly station so as further to reduce the possibility of any such particles getting between the press plates and foils. Furthermore since the foils are pulled from coils right at the assembly station, the possibility of them getting contaminated by handling is further eliminated. The result is an extremely compact and clean operation that produces high-quality boards suitable for making printed circuits.

In accordance with the invention a carriage is provided for transporting the press plates and the foils on the faces thereof from the lay-up station to an adjacent stacking station and for forming at the stacking station a stack of such press plates with foils on the faces thereof. The stack is periodically displacing the stack from the stacking station to an adjacent platen press. Once again handling is minimized.

The tunnel is provided according to the invention with means for feeding dust-free air into the tunnel against the faces of the plates therein for cleaning same of particles. Furthermore the press-plate feeder includes driven flanged rollers of variable spacing engaging longitudinal edges of the press plates in the tunnel and positioners engageable with trailing ends of the press plates in the tunnel. Each of these supports includes a centrally pivoted arm having a pair of ends and a respective holder for a respective coil on each of the ends. The arms are each pivotal between an inner position in each of which one of the ends holds the respective coil available for pulling the foil therefrom and an outer position in which the other of the ends is spaced outwardly therefrom. Empty coils are exchanged for full coils in the outer positions thereof.

The foil-feeder further includes according to the invention respective pneumatic slip boxes juxtaposed with the respective supports for guiding the respective foils to the assembly station. Each foil-feeder can have a respective suction belt engageable with the respective coil. Furthermore respective upper and lower pneumatic slip boxes form a feed gap aligned with the path at the assembly station between the cutter means and the foil-feeder.

In one system according to the invention the foilfeeder includes respective suction arms each having an end engageable with the respective coil and swingable between a position engaging the respective coil and a position immediately adjacent the path. Such a foil-feeder further includes respective rollers pivotally each movable independently of the suction arms between a position engaging the respective coil and a position immediately adjacent the path. The respective foil is spanned around the roller in the latter position.

In the laminate-making system in accordance with the invention the foil-feeders each include a feed roller displaceable between a feed position engaging the respective coil and a reloading position spaced from the respective coil.

The cutter of this invention can be a laser device or a simple shear. In addition the foil-feeder includes pneumatic slide boxes between each of the coils and the path. The respective foils pass over the respective boxes. In addition a pair of pinch rollers is engageable with the press plates through the foils immediately downstream of the cutter means.

The gripper beam according to the invention includes a plurality of vertically displaceable jaws engageable with leading edges of the press plates and the foils on the faces thereof. The stacking station is provided between the core-plate feeder and the lay-up station.

The laminate-making method of this invention comprises the steps of feeding a succession of press plates through a tunnel to and through an assembly station, blowing dust-free air against faces of the press plates in the tunnel to remove particles therefrom, pulling respective metallic foils from coils in the assembly station and applying them to the faces of the press plate as same are pulled through the assembly station, cutting the foils immediately downstream of the press plates as same leave the assembly station, stacking each of the press plates with the foils on its faces in a stacking station atop respective core plates and thereby forming therein a stack of core plates alternating with press plates interleaved with foils, and transporting the stacks to a platen press from the stacking station to a platen press.

The tunnel extends down to and around the stacking station and encloses the coils so that particles are eliminated from between the foils and the press plates. Furthermore core plates are synchronously stacked atop the press plates with foils on their faces in the stacking station.

BRIEF DESCRIPTION OF THE DRAWING

The above and other objects, features, and advantages will become more readily apparent from the following description, reference being made to the accompanying drawing in which:

FIG. 5 is a larger-scale view of the detail indicated at V in FIG. 4;

FIGS. 6 and 7 are views like FIG. 5 but showing the system in different operational positions;

SPECIFIC DESCRIPTION

Figure 1:
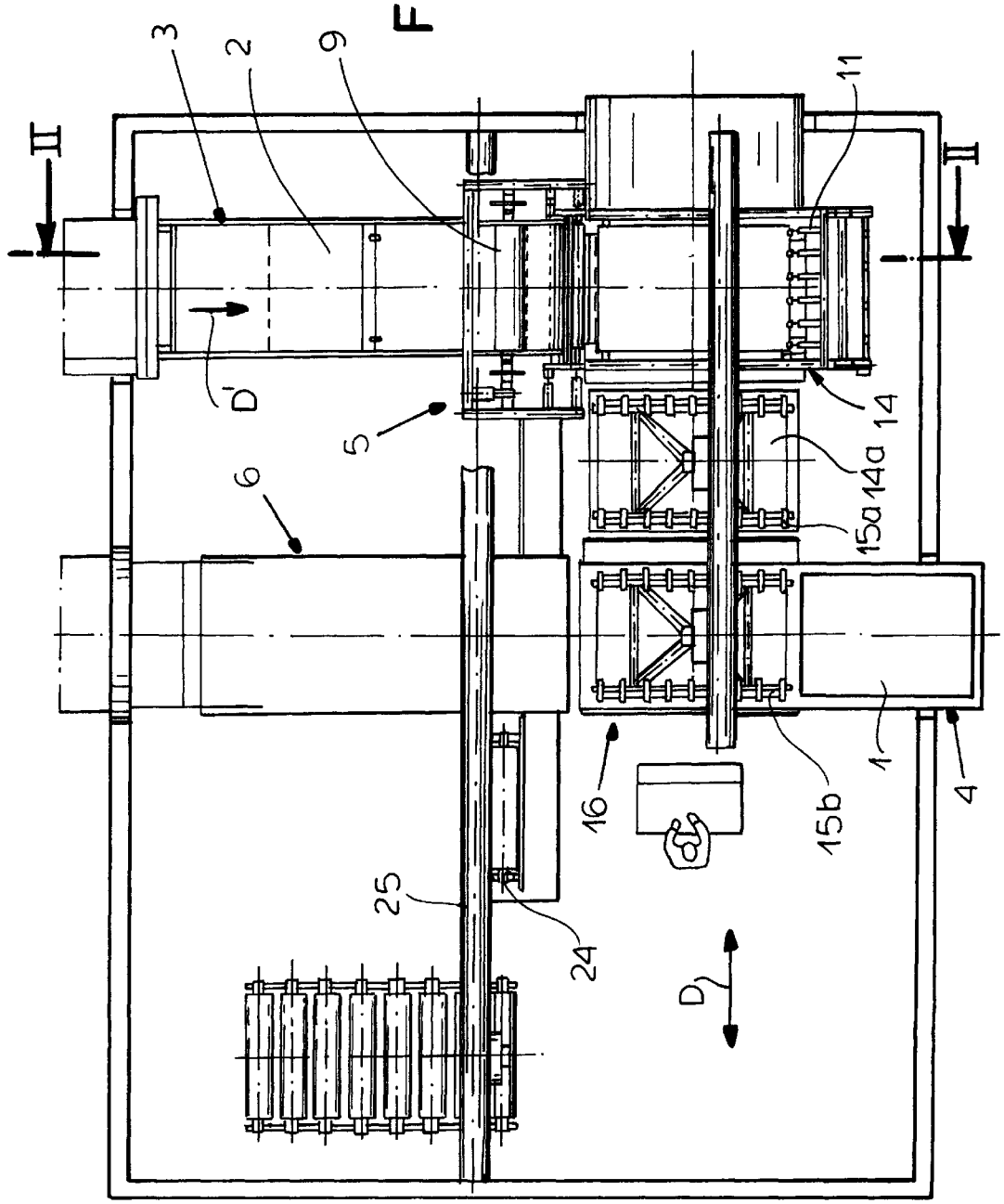
FIG. 1 is a small-scale partly diagrammatic top view of the laminate-making system of this invention.
Figure 2:
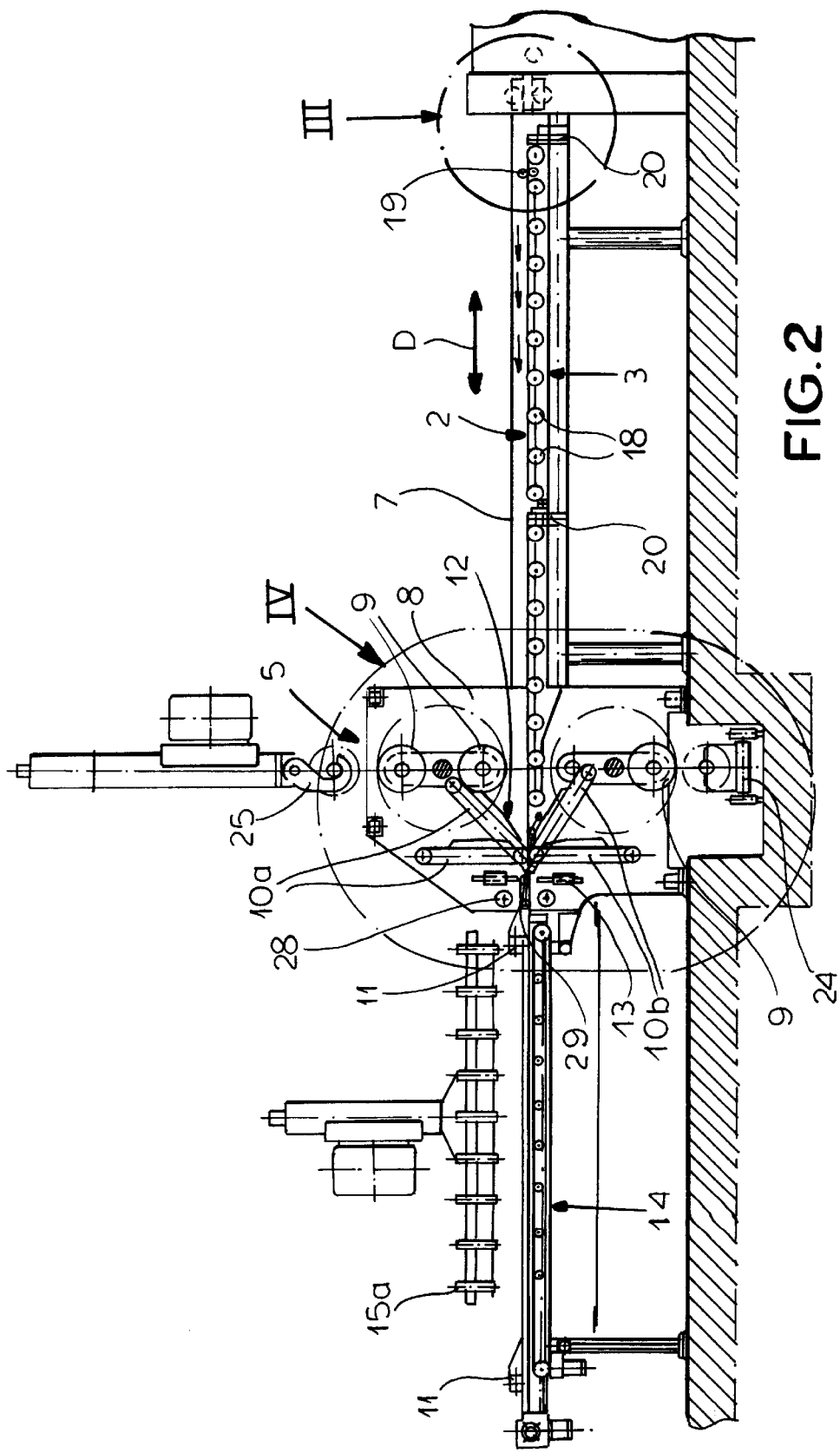
FIG. 2 is a larger-scale section taken along line II—II of FIG. 1.
Figure 3:
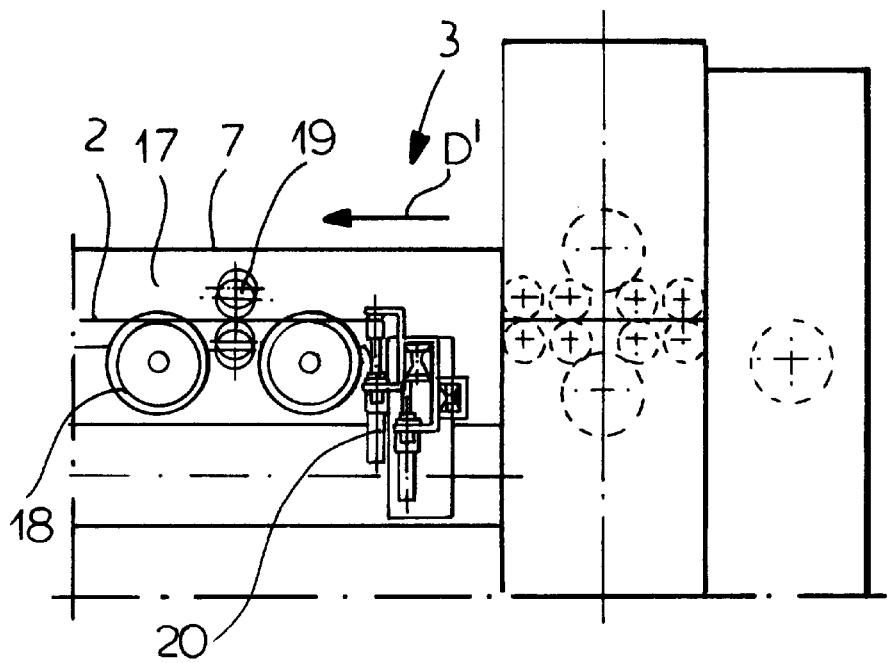
FIGS. 3 and 4 are larger-scale views of the details indicated respectively at III and IV in FIG. 2.

FIGS. 1 through 9 show an installation for producing industrial laminates comprising core plates 1 covered with copper foils 12. Stacks or books are built up from the core plates 1, the associated copper foils 12 and press plates 2 and these books are inserted into a platen press 34. The installation comprises at least one press-plate conveyor 3, a core-plate conveyor 4, a copper-foil conveyor 5 and a stack discharge device 6.

Figure 9:
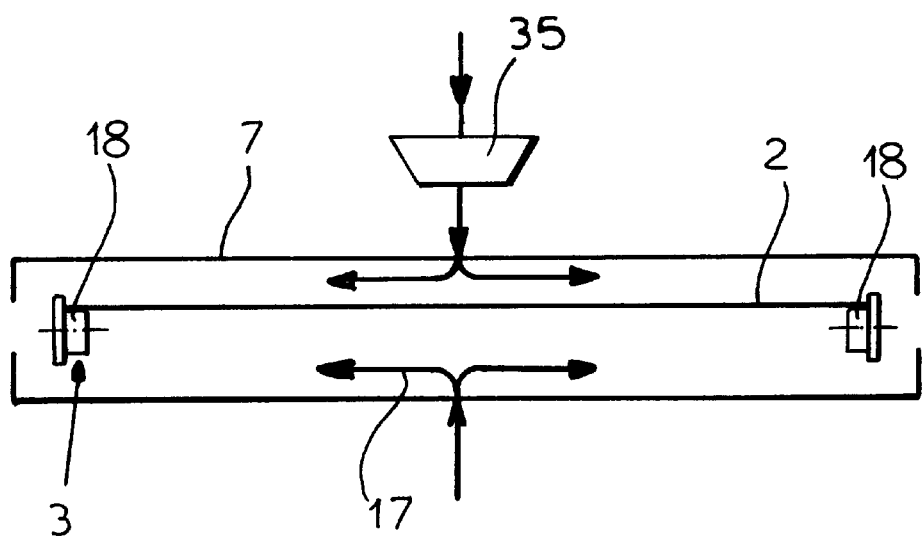
FIG. 9 is a cross section through the press-plate feeder.
Figure 4:
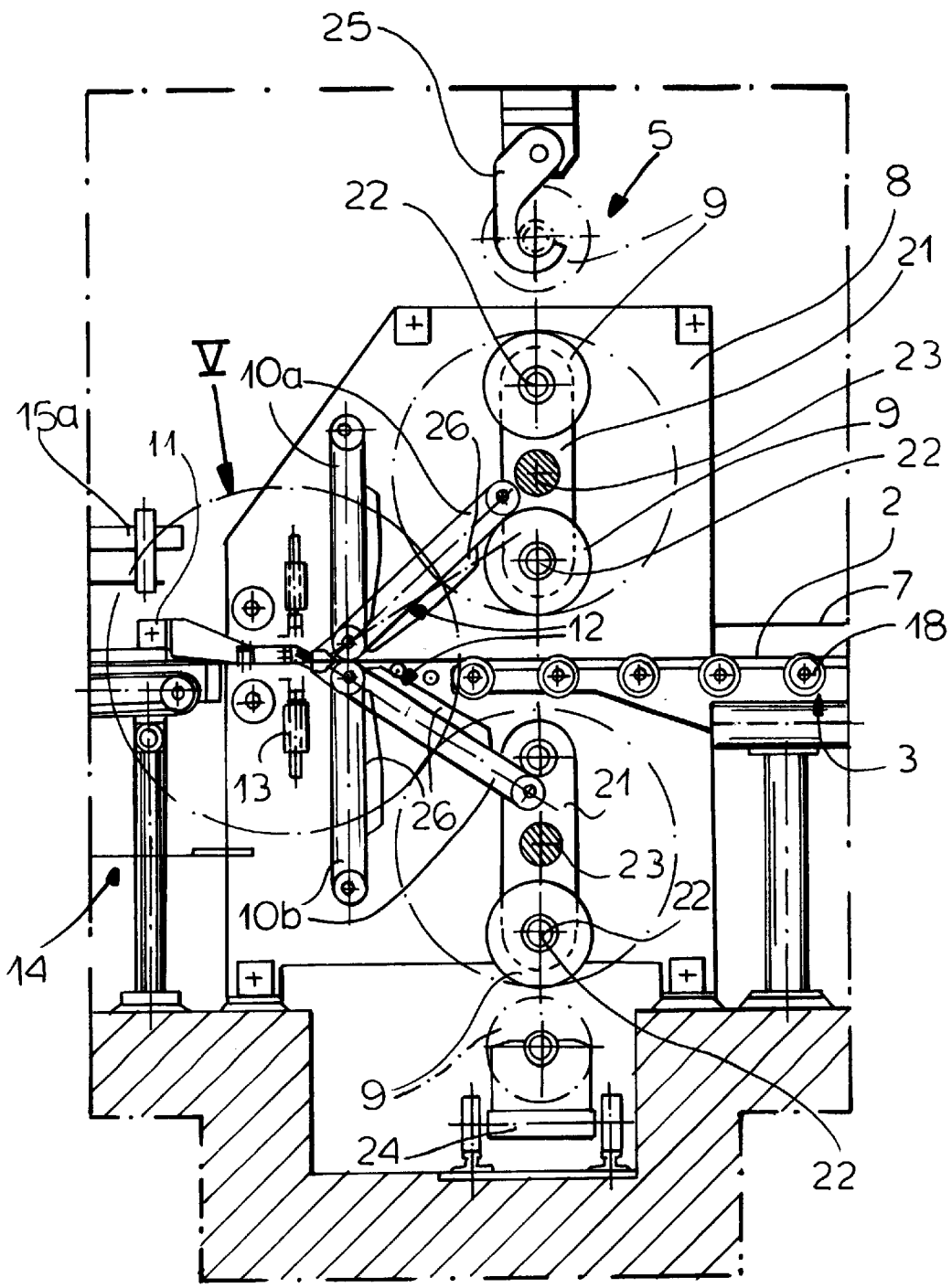

The press-plate conveyor 3 has a cover forming a tunnel 7, and together with the tunnel 7 extends into an assembly station 8 for bringing it together with the copper-foil conveyor 5. Clean filtered air is injected as shown in FIG. 9 by a blower 35 centrally into the top and bottom of the tunnel 7 to purge any dust therefrom. In the assembly station 8, copper-foil coils 9 and copper-foil feeders 10a and 10b pivotable relative to the copper-foil coils 9 are disposed above and below the press-plate conveyor 3. The copper-foil feeders 10a and 10b converge between the end of the press-plate conveyor 3. A gripper beam 11 is reciprocable in the travel direction D toward the press-plate conveyor 3 up to the region of the press plates 2 projecting over the end of the conveyor 3 in order to cover the press plates 2 on one or both sides with copper foils 12 pulled from the supply coils 9. A device 13 cuts the copper foils 12 from the continuous webs on the coils 9 between the gripper beam 11 and the converging copper-foil feeders 10a and 10b. The gripper beam 11 transfers the press plates 2 covered on one or both sides with copper foils 12 after the cutting operation to a lay-up station 14. At this lay-up station 14, the covered press plates 2 are picked up by a gripper carriage 15a and deposited on a lifting platform in a stacking station 14a. A gripper carriage 15b connected to the gripper carriage 15a takes one core plate 1 or set of core plates 1 at a time from a transfer station 16 associated with the core-plate conveyor 4 and deposits the core plate 1 or set of core plates 1 on the covered press plate 2. The covered press plates 2 and core plates 1 are then deposited on after the other until a stack or book of the desired height has been completed in the stacking station 14a. Next, a lifting platform in the stacking station 14a is lowered by a suitable amount for a loading plate bearing the finished stack to be transferred in a station 16 from the stacking station 14a to the stack discharge device 6. The second stacking device 6 is in the lower level of the transfer station 16. At the same time a new carrier plate is inserted under the lay-up station 14 into the stacking station 14a and a new operating cycle begins.

The press-plate conveyor 3 has flanged rollers 18 (see FIGS. 3 and 9) on both sides together with backing rollers (not shown) for careful handling of the press plates 2 which are supported only at their edges. The rollers are driven and the flanged rollers 18 are adjustable for the width of the respective press plate 2 transversely to the transverse direction D' of conveyance thereof. An alternative possibility is to provide driven conveying rollers 19 (FIG. 3) which grip the edges of the press plates 2 and move them until positioning elements 20 can detect the rear edges of the press plates 2.

At the upstream end of the press-plate conveyor 3 the positioning elements 20, which are vertically adjustable and reciprocable through a preset distance in the transverse direction D' of conveyance, are grippers that position the press plates 2 by gripping them at their rear edges and moving them forward.

In the assembly station 8 the copper-foil coils 9 are mounted on arms 21 with spindles 22 offset from one another by 180°. The arms 21 together with the two spindles 22 are pivotable through 180° around central pivot axes 23 so that the spindles 22 can be swung between a reloading position and a foil delivery position. A coil-changing device in the form of a carriage 24 is movable under the lower reloading position and a coil-changing device in the form of a hoist 25 is movable over the upper reloading position. The carriage 24 can also be loaded by the hoist 25. The pivots 23 of the arms 21 and the spindles 22 themselves can have individual mechanical drives.

The copper-foil feeders b1a and lob are formed as conveyor belts, e.g. suction-belt conveyors associated with pneumatic glide platforms 26, and can be simultaneously pivoted about the axes of their downstream rollers toward or away from the copper-foil coils 9 between basically vertical out-of-use positions with their upstream ends out of engagement with the respective supply coils 9 and inclined use positions with their upstream ends engaging the respective coils 9. In the use position each such feeder 10*a* and 10*b* forms with the respective blow-box or pneumatic strip 26 a guide gap opening downstream toward the press plate 2 being fed in in direction D by the conveyor 3. Respective further blow boxes or pneumatic strips 27*a* and 27*b* (see FIG. 8) vertically flank the path followed by the plate 2 and two foils 12 immediately downstream of the downstream ends of the feeders 10*a* and 10*b* to maintain these foils 12 in tight surface contact with the respective faces of the press plate 2.

Figure 8:
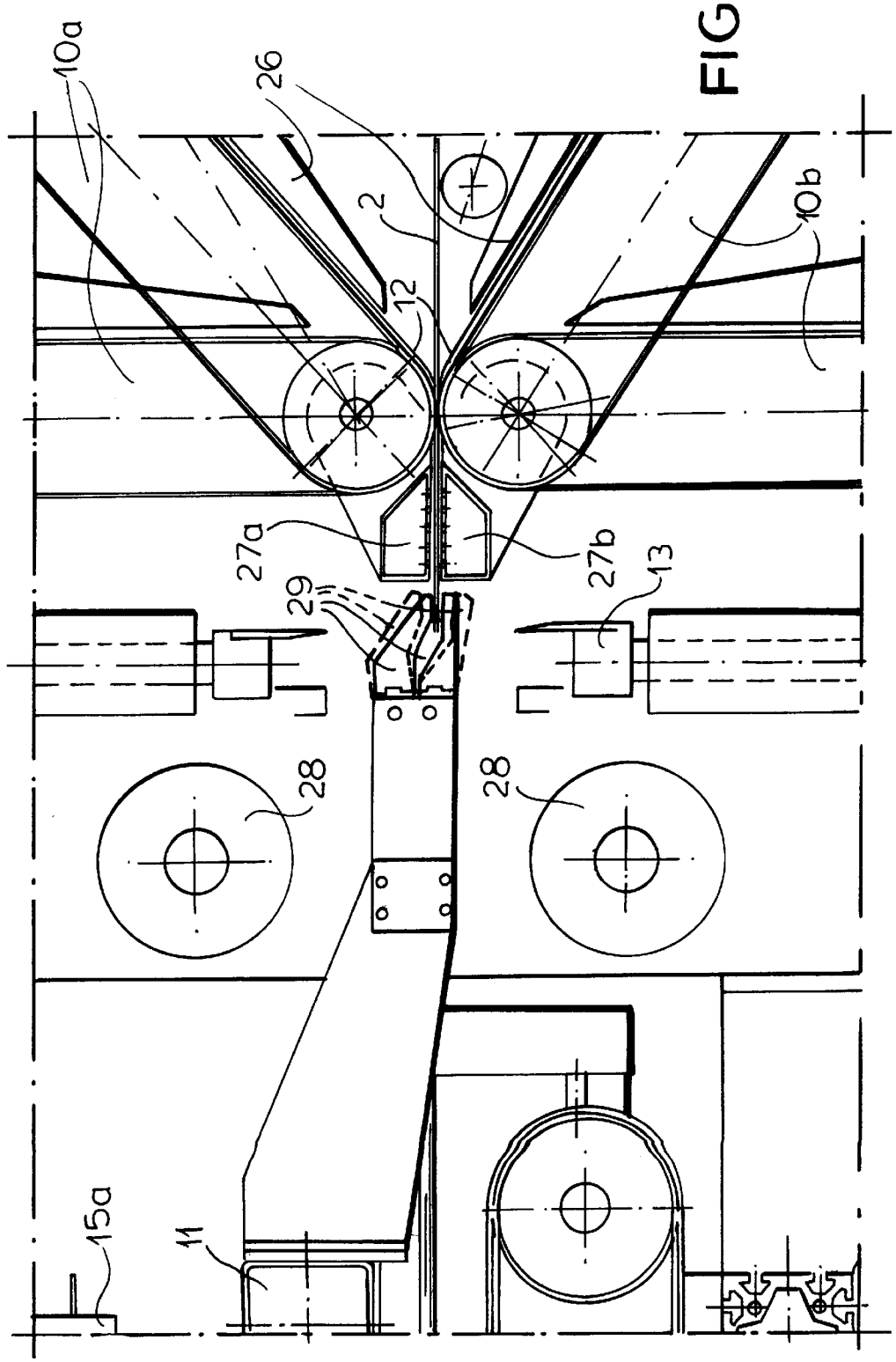
FIG. 8 is a large-scale view of the structure of FIG. 5.

The cutter 13 is in the form of shears, e.g. hammer shears, or a laser cutter. Pressure rollers 28 or pairs of rollers adjustable in the conveying direction relative to the press plates 2 covered with copper foils 12 are disposed downstream of the cutter 13. The gripper beam 11 has a jaw provided with a plurality of grippers 29 which grip the front edge of the press plates 2 covered on one or both sides with copper foils 12 and pull them into the lay-up station 14. The open position of the grippers 29 is indicated in FIG. 8 by dashed lines.

Thus as shown in FIG. 5 the gripper beam 11 first moves upstream in direction D to grip the leading edge of a press platen 2 covered on one or both faces with copper foils 12. To do this the pinch rollers 28 are moved apart as well as the two shear bars of the cutter 13. Then as shown in FIG. 6 the beam 11 is retracted downstream and the rollers 28 are moved together to grip the plate 2 covered by the foils 12, ensuring solid engagement of the foils 12 to the plate 2. Finally as shown in FIG. 7 the cutter 13 is actuated to cut the foils 12 at the trailing edge of the press plate 2 and immediately.

In the exemplified embodiment, the gripper carriages 15*a* and 15*b* are movable alternatively over the stacking station 14*a* and over the lay-up station 14 or the core-plate conveyor 4, i.e. the gripper carriage 15*a* is movable over the lay-up station 14 and the stacking station 14*a* and the gripper carriage 15*b* is movable over the stacking station 14*a* and over the core-plate conveyor 4.

Figure 10:
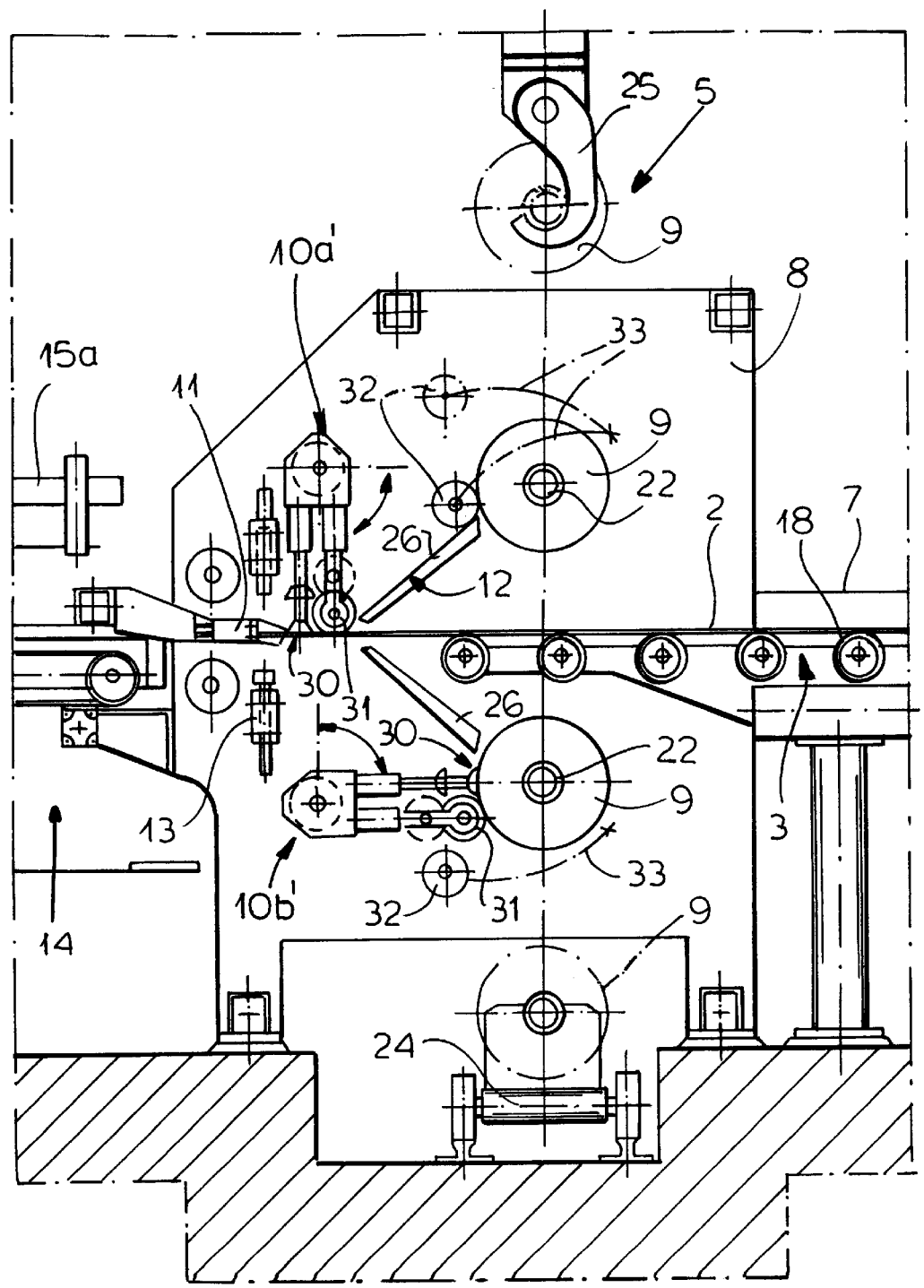
FIG. 10 is a view like FIG. 4 but illustrating another system in accordance with the invention.

FIG. 10 shows a modified embodiment of the copper-foil feeders 10*a*' and 10*b*'. In the drawing, the pivotally mounted feed units 10*a*' and 10*b*' each have at least one suction strip 30 and can be swung into a foil-receiving position engaging the respective copper-foil coils 9 or out of the foil-receiving position into a foil delivery position toward the press plate 2 which is to be covered. The feed units have foil guide rollers 31 upstream of the suction strips 30 in the direction of conveyance D' of the press plates 2. These rollers 31 are provided with sensors for reporting their position and how much foil is left on the respective coil. The suction strips 30 and the foil guide rollers 31 can be moved forward and back independently of one another. The cover foil coils 9, at least on the side of the feed units, are associated with guide rollers 32 which can be swung forward and back. The guide rollers 32 are mounted on curved locking levers 33 which surround the copper foil coils 9 and the spindles 22 carrying them. The drives for pivoting the guide rollers 32 or rocking levers 33 are not shown. Copper foil transfer tracks, e.g. pneumatic glide platforms 26, are disposed in this embodiment also between the copper foil coils 9 and the assembly area 8, i.e. where the press plates 2 are covered with copper foils 12. The spindles 22 can be driven shaft journals.

In the embodiment in FIG. 10 the upper feed unit 10*a* is in the foil delivery position and its guide roller 32 is pivoted toward the upper copper foil coil 9, whereas the lower feed unit 10*b* is in the copper foil receiving position and its guide roller 32 is pivoted away in order to clear the way for the feed unit 10*b* to move into the copper foil receiving position.

I claim:
1. A laminate-making system comprising:
   a housing forming a tunnel extending in a transport direction and having a downstream end at an assembly station;
   press-plate feed means for conveying a succession of press plates along a path through the tunnel to the assembly station;
   respective upper and lower supports holding respective upper and lower coils of metallic foil above and below the path at the assembly station;
   core-plate feed means for conveying a succession of core plates to a lay-up station adjacent the assembly station;
   respective upper and lower foil-feed means for pulling the foils off the respective coils and applying them to upper and lower faces of the press plates at the assembly station;
   means including a gripper beam for engaging leading ends of the foils and of the press plate in the assembly station for pulling the press plate and the foils from the assembly station into the lay-up station and depositing the press plate and foils atop the core plate therein; and
   cutter means for transversely severing the foils immediately downstream of the press plate after the press plate has been pulled by the gripper beam from the assembly station into the lay-up station.

2. The laminate-making system defined in claim 1, further comprising:
   means including a carriage for transporting the press plates and the foils on the faces thereof from the lay-up station to an adjacent stacking station and for forming at the stacking station a stack of the press plates with foils on the faces thereof; and
   means for periodically displacing the stack at the stacking station to an adjacent platen press.

3. The laminate-making system defined in claim 1, further comprising
   means for feeding dust-free air into the tunnel against the faces of the plates therein for cleaning same of particles.

4. The laminate-making system defined in claim 1 wherein the press-plate feed means includes driven flanged rollers of variable spacing engaging longitudinal edges of the press plates in the tunnel.

5. The laminate-making system defined in claim 1 wherein the press-plate feed means includes positioners engageable with trailing ends of the press plates in the tunnel.

6. The laminate-making system defined in claim 1 wherein each of the supports includes
   a centrally pivoted arm having a pair of ends,
   a respective holder for a respective coil on each of the ends, the arms each being pivotal between an inner position in each of which one of the ends holds the respective coil available for pulling the foil therefrom and an outer position in which the other of the ends is spaced outwardly therefrom,
   means for exchanging empty for full coils from the holders in the outer positions thereof.

7. The laminate-making system defined in claim 6 wherein the foil-feed means includes respective pneumatic slip boxes juxtaposed with the respective supports for guiding the respective foils to the assembly station.

8. The laminate-making system defined in claim 6 wherein the foil-feed means includes respective suction belts engageable with the coils.

9. The laminate-making system defined in claim 1, further comprising respective upper and lower pneumatic slip boxes forming a feed gap aligned with the path at the assembly station between the cutter means and the foil-feed means.

10. The laminate-making system defined in claim 1 wherein the foil-feed means includes respective suction arms each having an end engageable with the respective coil and swingable between a position engaging the respective coil and a position immediately adjacent the path.

11. The laminate-making system defined in claim 10 wherein the foil-feed means further includes respective rollers pivotally each movable independently of the suction arms between a position engaging the respective coil and a position immediately adjacent the path, the respective foil being spanned around the roller in the latter position.

12. The laminate-making system defined in claim 1, wherein the foil-feed means each include a feed roller displaceable between a feed position engaging the respective coil and a reloading position spaced from the respective coil.

13. The laminate-making system defined in claim 1 wherein the cutter means is a shear.

14. The laminate-making system defined in claim 1 wherein the foil-feed means includes pneumatic slide boxes between each of the coils and the path, the respective foils passing over the respective boxes.

15. The laminate-making system defined in claim 1, further comprising a pair of pinch rollers engageable with the press plates through the foils immediately downstream of the cutter means.

16. The laminate-making system defined in claim 1 wherein the gripper beams includes a plurality of vertically displaceable jaws engageable with leading edges of the press plates and the foils on the faces thereof.

17. The laminate-making system defined in claim 1 wherein the stacking station is provided between the core-plate feed means and the lay-up station.

* * * * *